United States Patent
Lee et al.

(10) Patent No.: US 12,033,924 B2
(45) Date of Patent: Jul. 9, 2024

(54) SEMICONDUCTOR PACKAGE

(71) Applicant: Samsung Electronics Co., Ltd., Suwon-si (KR)

(72) Inventors: Jeonghyun Lee, Seoul (KR); Hwanpil Park, Hwaseong-si (KR); Jongbo Shim, Asan-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 121 days.

(21) Appl. No.: 17/542,828

(22) Filed: Dec. 6, 2021

(65) Prior Publication Data

US 2022/0384320 A1 Dec. 1, 2022

(30) Foreign Application Priority Data

Jun. 1, 2021 (KR) .................. 10-2021-0070958

(51) Int. Cl.
*H01L 23/64* (2006.01)
*H01L 23/31* (2006.01)
*H01L 23/498* (2006.01)
*H01L 25/18* (2023.01)

(52) U.S. Cl.
CPC .... *H01L 23/49811* (2013.01); *H01L 23/3121* (2013.01); *H01L 23/49822* (2013.01); *H01L 23/49827* (2013.01); *H01L 23/642* (2013.01); *H01L 25/18* (2013.01)

(58) Field of Classification Search
CPC ............. H01L 23/642; H01L 23/49833; H01L 23/49589
See application file for complete search history.

(56) References Cited

U.S. PATENT DOCUMENTS

| | | | |
|---|---|---|---|
| 8,263,439 B2 | 9/2012 | Marimuthu et al. | |
| 9,520,387 B2 | 12/2016 | Kim et al. | |
| 9,613,917 B2 | 4/2017 | Hsiao et al. | |
| 10,269,582 B2 | 4/2019 | Hwang et al. | |
| 11,239,205 B2* | 2/2022 | Hu | H01L 23/5223 |
| 2004/0056341 A1* | 3/2004 | Endo | H01L 23/50 |
| | | | 257/E23.079 |
| 2004/0188497 A1* | 9/2004 | Gruber | H01L 24/81 |
| | | | 257/E21.531 |
| 2007/0090546 A1* | 4/2007 | Shioga | H01L 23/50 |
| | | | 257/E23.079 |
| 2008/0099888 A1* | 5/2008 | Kurihara | H01L 23/481 |
| | | | 257/E23.079 |
| 2014/0103516 A1* | 4/2014 | Yeom | H01L 23/49827 |
| | | | 257/685 |
| 2017/0125386 A1 | 5/2017 | Hsiao et al. | |
| 2017/0256508 A1* | 9/2017 | Zhuang | H01L 24/11 |
| 2019/0013301 A1* | 1/2019 | Cheah | H01L 23/49822 |
| 2020/0058569 A1* | 2/2020 | Cho | H01L 21/6835 |
| 2020/0344894 A1* | 10/2020 | Liu | H05K 3/4038 |
| 2020/0381405 A1* | 12/2020 | Patil | H01L 23/50 |
| 2022/0068846 A1* | 3/2022 | Ong | H01L 25/18 |

* cited by examiner

*Primary Examiner* — Michele Fan
(74) *Attorney, Agent, or Firm* — Harness, Dickey & Pierce, P.L.C.

(57) ABSTRACT

A semiconductor package includes a package substrate, an interposer, a semiconductor chip between the package substrate and the interposer, a plurality of conductive connectors between the package substrate and the interposer, and a capacitor stack structure between the package substrate and the interposer, he capacitor stack structure including a first capacitor connected to the package substrate, and a second capacitor connected to the interposer.

20 Claims, 13 Drawing Sheets

SEMICONDUCTOR PACKAGE

CROSS-REFERENCE TO RELATED APPLICATION

This application is based on and claims priority under 35 U.S.C. § 119 to Korean Patent Application No. 10-2021-0070958, filed on Jun. 1, 2021, in the Korean Intellectual Property Office, the disclosure of which is incorporated by reference herein in its entirety.

BACKGROUND

The inventive concepts relate to a semiconductor package, and more particularly, to a package-on-package structure using an interposer.

Due to the rapid development of the electronics industry and the needs of users, electronic devices have become smaller, more multifunctional, and greater in capacity, and accordingly, a semiconductor package including a plurality of semiconductor chips is required. In order to meet the industrial requirement, various methods of packaging processes have been developed. For example, an interposer is an electrical interface that routes connection within one package or between different packages. A purpose of the interposer is to spread a pitch of a wiring to a wider pitch or to re-route a connection to another connection. Representative technology using such an interposer includes an interposer package on package (IPOP) that provides a semiconductor package on another semiconductor package.

SUMMARY

The inventive concepts provide a semiconductor package including an interposer.

According to an aspect of the inventive concepts, there is provided a semiconductor package. The semiconductor package includes a package substrate; an interposer; a semiconductor chip between the package substrate and the interposer; a plurality of conductive connectors between the package substrate and the interposer; and a capacitor stack structure between the package substrate and the interposer, the capacitor stack structure including a first capacitor connected to the package substrate, and a second capacitor connected to the interposer.

According to another aspect of the inventive concepts, there is provided a semiconductor package. The semiconductor package includes a package substrate; an interposer; a logic chip between the package substrate and the interposer; conductive connectors electrically connecting the interposer and the package substrate; a capacitor stack structure between the interposer and the package substrate, the capacitor stack structure including a first capacitor electrically connected to the package substrate, a second capacitor to be electrically connected to the interposer, and an adhesive film between the first and second capacitors; a filler between the package substrate and the interposer and contacting the logic chip and the conductive connectors; and an upper semiconductor package on the interposer and including one or more memory chips.

According to another aspect of the inventive concepts, there is provided a semiconductor package. The semiconductor package a redistribution layer including insulating layers, redistribution patterns extending in a horizontal direction within the insulating layers; redistribution vias connected to at least one of the redistribution patterns and extending in a vertical direction within the insulating layers; and first and second redistribution pads on the insulating layers and connected to at least one of the redistribution vias; an interposer; a logic chip between the redistribution layer and the interposer; an insulating layer between the redistribution layer and the interposer and surrounding the logic chip; a plurality of vias penetrating through the insulating layers in the vertical direction and connected to the first redistribution pads; and a capacitor stack structure between the redistribution layer and the interposer, the capacitor stack structure having a length in the vertical direction greater than a length of the logic chip in the vertical direction.

BRIEF DESCRIPTION OF THE DRAWINGS

Example embodiments of the inventive concepts will be more clearly understood from the following detailed description taken in conjunction with the accompanying drawings in which.

DETAILED DESCRIPTION OF THE EMBODIMENTS

Figure 1:
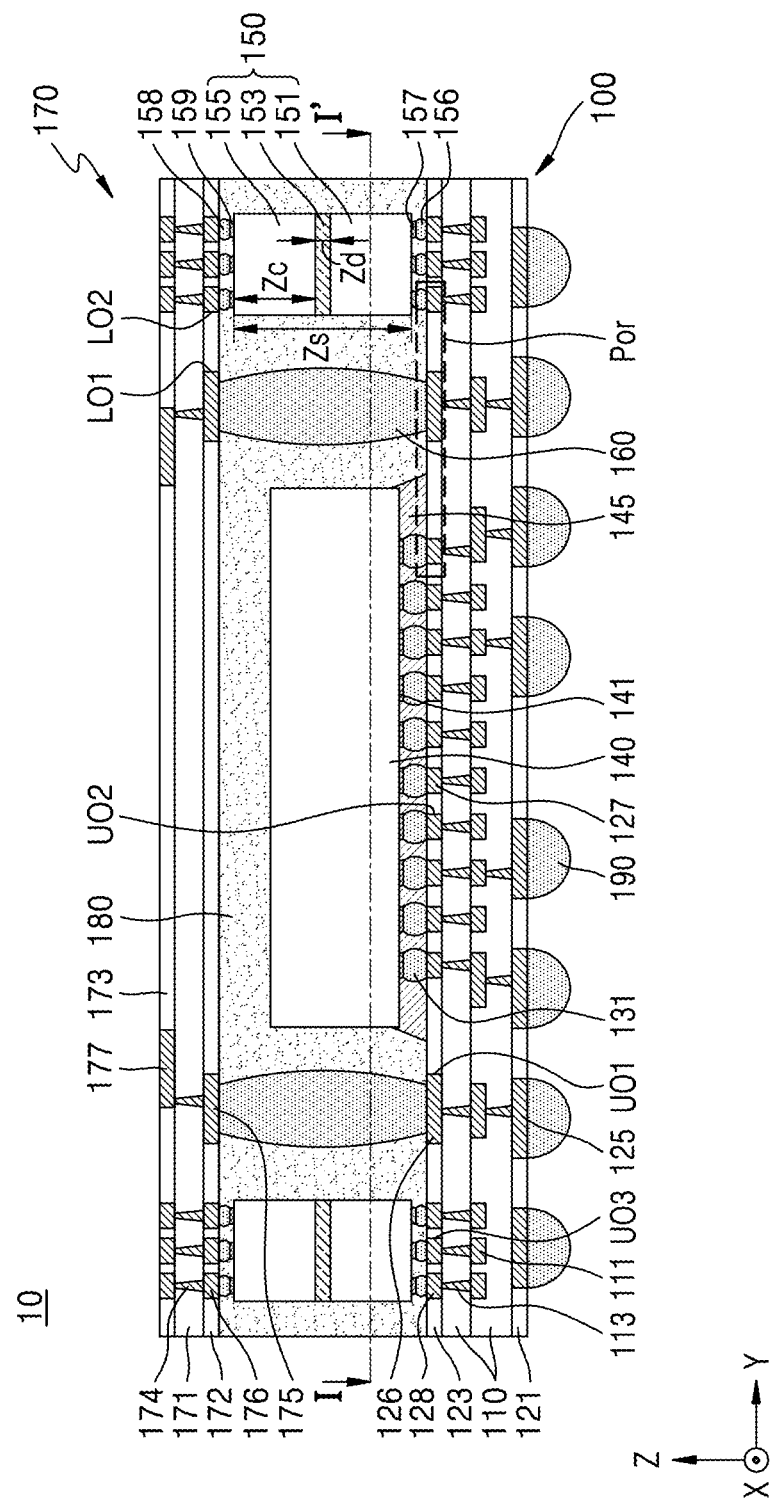
FIG. 1 is a cross-sectional view illustrating a semiconductor package according to some example embodiments.

Hereinafter, some example embodiments of the technical idea of the inventive concepts will be described in detail with reference to the accompanying drawings. The same reference numerals are used for the same components in the drawings, and repeated descriptions thereof are omitted.

Spatially relative terms, such as "vertical," "horizontal," "below," "lower," "under," "above," "upper," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, the device may be otherwise oriented (e.g., rotated 90 degrees or at other orientations) and the spatially relative descriptors used herein interpreted accordingly.

Figure 2A:
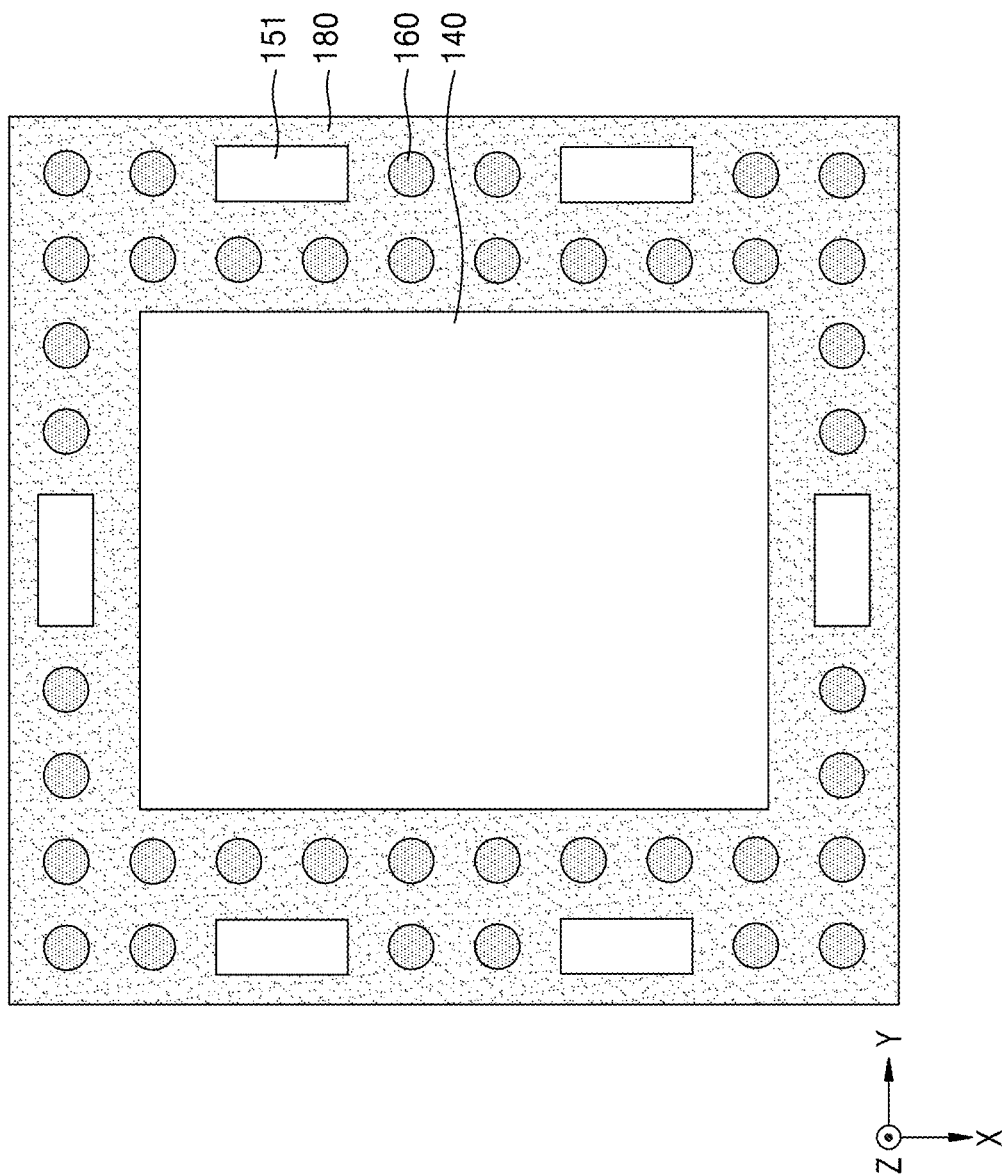
FIG. 2A is a cross-sectional view taken along line I-I' of FIG. 1.

When the terms "about" or "substantially" are used in this specification in connection with a numerical value, it is intended that the associated numerical value includes a manufacturing tolerance (e.g., ±10%) around the stated numerical value. Moreover, when the words "generally" and "substantially" are used in connection with geometric shapes, it is intended that precision of the geometric shape is not required but that latitude for the shape is within the scope of the disclosure. Further, regardless of whether numerical values or shapes are modified as "about" or "substantially," it will be understood that these values and shapes should be construed as including a manufacturing or operational tolerance (e.g., ±10%) around the stated numerical values or shapes FIG. 1 is a cross-sectional view illustrating a semiconductor package 10 according to some example embodiments; FIG. 2A is a cross-sectional view taken along line I-I' of FIG. 1; and FIG. 2B is an enlarged partial cross-sectional view illustrating a region Por of FIG. 1.

Figure 2B:
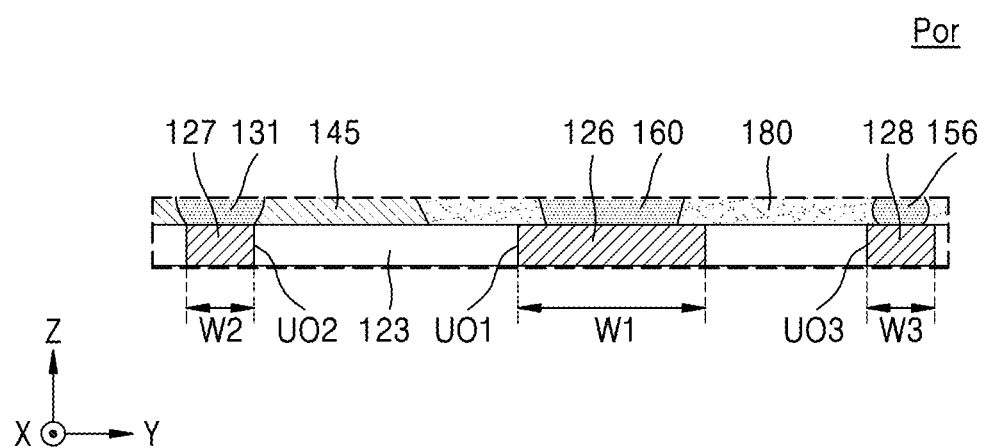
FIG. 2B is an enlarged partial cross-sectional view illustrating a portion of FIG. 1.

Referring to FIGS. 1 to 2B, the semiconductor package 10 may include a package substrate 100, a first semiconductor chip 140, capacitor stack structures 150, conductive connectors 160, an interposer 170, and an insulating filler 180.

Herein, the two directions parallel to an upper surface of the package substrate 100 and perpendicular to each other are defined as an X direction and a Y direction, respectively, and a direction perpendicular to the upper surface of the package substrate 100 is defined as a Z direction. Unless otherwise mentioned, the definition of the directions described above is the same in the drawings below.

The package substrate 100 may be, for example, a circuit board such as a printed circuit board (PCB), an injection molding circuit board and/or a stamped circuit board (SCB). The package substrate 100 may include a substrate base 110 including a plastic and/or or resin (e.g., at least one of a phenol resin, an epoxy resin, and/or a polyimide). The package substrate 100 may include lower pads 125 disposed on a lower surface of the substrate base 110 and a plurality of upper pads (e.g., first to third upper pads 126, 127, and 128) disposed on an upper surface of the substrate base 110. The substrate base 110 may include conductive patterns 111 and conductive vias 113 configured to be electrically connect at least one of the lower pads 125 to at least any one of the first to third upper pads 126, 127, and 128.

The conductive patterns 111 may extend in a horizontal direction (e.g., the X direction and/or the Y direction) in the package substrate 100, and the conductive vias 113 may extend in a vertical direction (e.g., the Z direction) in the package substrate 100. Each of the conductive vias 113 may be tapered from a lower protective layer 121 toward an upper protective layer 123. For example, the width of the conductive vias 113 may be greater nearer a lower surface of the substrate base 110 than an upper surface of the substrate base 110. In some example embodiments, the package substrate 100 and the semiconductor chip 140 may be provided, e.g., by a chip first process in which the package substrate 100 is formed after the semiconductor chip 140 is provided.

The upper protective layer 123 may be formed on an upper surface of the substrate base 110, and the lower protective layer 121 may be formed on a lower surface of the substrate base 110. Lower openings exposing the lower pads 125 may be formed in the lower protective layer 121. A plurality of upper openings (e.g., first to third upper openings UO1, UO2, and UO3) exposing a plurality of upper pads (e.g., the first to third upper pads 126, 127, and 128) may be formed in the upper protective layer 123. In some example embodiments, the first upper openings UO1 may expose the first upper pads 126, the second upper openings UO2 may expose the second upper pads 127, and the third upper openings UO3 may expose the third upper pads 128.

The upper protective layer 123 and/or the lower protective layer 121 may include, for example, solder resist. For example, upper protective layer 123 and/or the lower protective layer 121 may include solder resist between neighboring openings (e.g., neighboring lower openings; neighboring second openings UO2, neighboring third openings UO3, a first opening UO1 and a neighboring third opening UO3, a first opening UO1 and a neighboring second opening UO2, and/or the like). The solder resist may include, for example, a polymer and/or a polymer like material, which resists wetting by a solder.

According to some example embodiments, a planar shape of the first to third upper openings UO1, UO2, and UO3 may be approximately a quadrangle. According to some example embodiments, the volume of a first upper opening UO1 may be greater than the volume of a third upper opening UO3. According to some example embodiments, the volume of a second upper opening UO2 may be greater than the volume of a third upper opening UO3. According to some example embodiments, a horizontal width W1 (e.g., an X directional width and/or a Y directional width) of each of the first upper openings UO1 may be greater than a horizontal width W3 of each of the third upper openings UO3 (e.g., an X directional width and/or a Y directional width). According to some example embodiments, a horizontal width W2 (e.g., an X-directional width and/or a Y-directional width) of each of the second upper openings UO2 may be greater than a horizontal width W3 of each of the third upper openings UO3. (e.g., an X directional width and/or a Y directional width). According to some example embodiments, the horizontal width W1 of each of the first upper openings UO1 may range from about 100 μm to about 200 μm; and/or the horizontal width W3 of each of the third upper openings UO3 may range from about 10 μm to about 100 μm.

The conductive patterns 111, the conductive vias 113, the lower pads 125, and the plurality of upper pads (e.g., first to third upper pads 126, 127, and 128) may each include a conductive material, for example, copper (Cu), aluminum (Al), tungsten (W), titanium (Ti), tantalum (Ta), indium (In), molybdenum (Mo), manganese (Mn), cobalt (Co), tin (Sn), nickel (Ni), magnesium (Mg), rhenium (Re), beryllium (Be), gallium (Ga), and ruthenium (Ru), alloys thereof, and/or the like, but is not limited thereto.

The conductive connectors 160 may be attached to the first upper pads 126, chip connection bumps 131 may be attached to the second upper pads 127, and capacitor connection bumps 156 may be attached to the third upper pads 128. According to some example embodiments, each of the chip connection bumps 131 and the capacitor connection bumps 156 may be a micro bump. According to some example embodiments, the capacitor connection bumps 156 may be smaller than the chip connection bumps 131. According to some example embodiments, the capacitor connection bumps 156 may be smaller than the conductive connectors 160.

According to some example embodiments, the conductive connectors 160 may be connected to the first upper pads 126 through the first upper openings U01 of the upper protective layer 123; the chip connection bumps 131 may be connected to the second upper pads 127 through the second upper openings UO2 of the upper protective layer 123; and/or the capacitor connection bumps 156 may be connected to the third upper pads 128 through the third upper openings UO3 of the upper protective layer 123.

Connection terminals 190 may be attached to the lower pads 125. The connection terminals 190 may be connected to the lower pads 125 through the lower openings of the lower protective layer 121. The connection terminals 190 may include solder, and/or may be, for example, solder balls. The connection terminals 190 may provide an electrical connection between the semiconductor package 10 and an external device (not illustrated).

The semiconductor chip 140 may be mounted on the package substrate 100. The semiconductor chip 140 may be between the package substrate 100 and the interposer 170 in the vertical direction (e.g., the Z direction) perpendicular to the upper surface of the package substrate 100.

The semiconductor chip 140 may include a semiconductor substrate having an active surface and an inactive surface opposite to each other, and may include a semiconductor device layer (not shown) formed on the active surface of the semiconductor substrate. The semiconductor chip 140 may include a lower surface and an upper surface opposite to each other, and chip pads 141 may be provided on the lower surface of the semiconductor chip 140. In some example embodiments, the lower surface of the semiconductor chip 140 may be a surface adjacent to the active surface of the semiconductor substrate, and the upper surface of the semiconductor chip 140 may be a surface adjacent to the inactive surface of the semiconductor substrate. The chip pads 141 of the semiconductor chip 140 may be electrically connected to the semiconductor device layer through a wiring structure (not shown) provided inside the semiconductor chip 140.

According to some example embodiments, the semiconductor chip 140 may be a memory chip and/or a non-memory chip. For example, the semiconductor chip 140 may be a logic chip including at least one of a deep learning model, a microprocessor, a graphics processor, a signal processor, a network processor, a chipset, an audio codec, a video codec, an application processor, and/or the like.

In some example embodiments, the semiconductor chip 140 may include a volatile memory chip and/or a non-volatile memory chip. The volatile memory chip may include, for example, dynamic random access memory (DRAM), static RAM (SRAM), thyristor RAM (TRAM), zero capacitor RAM (ZRAM), twin transistor RAM (TTRAM), and/or the like. The non-volatile memory chip may include, for example, flash memory, magnetic RAM (MRAM), spin-transfer torque MRAM (STT-MRAM), ferroelectric RAM (FRAM), phase change RAM (PRAM), resistive (RRAM), nanotube RRAM, polymer RAM, insulator resistance change memory, and/or the like.

The semiconductor chip 140 may be mounted on the package substrate 100 in a face-down manner or a flip chip manner. For example, the lower surface of the semiconductor chip 140 on which the chip pads 141 are formed may face the package substrate 100. The chip pads 141 of the semiconductor chip 140 may be electrically connected to the second upper pads 127 through the chip connection bumps 131. The chip pads 141 may be used as a terminal for transmitting input/output data signals of the semiconductor chip 140, and/or a terminal for power and/or grounding of the semiconductor chip 140.

An underfill material layer 145 may surround the chip connection bumps 131 between the semiconductor chip 140 and the package substrate 100. For example, the underfill material layer 145 may include an epoxy resin formed by a capillary under-fill process. In some example embodiments, the underfill material layer 145 may be a non-conductive film. In some example embodiments, the insulating filler 180 may directly fill a gap between the semiconductor chip 140 and the package substrate 100, such as, by a molded underfill method. In this case, the underfill material layer 145 may be omitted and/or indistinguishable from the insulating filler 180.

The interposer 170 may be disposed on the package substrate 100 and the semiconductor chip 140. The interposer 170 may include a base insulating layer 171, a lower insulating layer 172, an upper insulating layer 173, conductive vias 174, a plurality of lower pads (e.g., first and second lower pads 175 and 176), and upper pads 177.

The base insulating layer 171 may include a plastic and/or resin. For example, the based insulating layer 171 may include at least of a phenol resin, an epoxy resin, and/or a polyimide. For example, the base insulating layer 171 may include at least of polyimide, flame retardant 4 (FR-4), tetrafunctional epoxy, polyphenylene ether, epoxy/polyphenylene oxide, bismaleimide triazine (BT), thermount, cyanate ester, and/or a liquid crystal polymer. In some example embodiments, the base insulating layer 171 and the package substrate 100 may include the same and/or similar materials.

The upper pads 177 may be disposed on an upper surface of the base insulating layer 171. The plurality of lower pads (e.g., first and second lower pads 175 and 176) may be disposed on a lower surface of the base insulating layer 171. The conductive vias 174 may penetrate through the base insulating layer 171. External connection terminals such as solder and bumps may be provided on the upper pads 177. The upper pads 177 may provide a connection to a semiconductor chip or a semiconductor package mounted on the interposer 170.

The first lower pads 175 may contact the conductive connectors 160. Each of the first lower pads 175 may be connected to a corresponding one of the first upper pads 126 through the conductive connectors 160. Accordingly, an electrical connection may be provided between the package substrate 100 and the interposer 170.

The conductive vias 174 may contact each of the upper pads 177 and the first and second lower pads 175 and 176. For example, each of the first and second lower pads 175 and 176 may be configured to be electrically connected to a corresponding one of the upper pads 177 through the conductive vias 174.

The conductive vias 174, the first and second lower pads 175 and 176, and the upper pads 177 may include a conductive material (e.g., any one of the materials described above in relation to the conductive patterns 111, the conductive vias 113, the lower pads 125, and the first to third upper pads 126, 127, and 128).

The upper insulating layer 173 may be disposed on an upper surface of the base insulating layer 171, and the lower insulating layer 172 may be disposed on a lower surface of the base insulating layer 171. For example, the upper insulating layer 173 may cover the upper surface of the base insulating layer 171. The upper insulating layer 173 may include upper openings exposing the upper pads 177.

The lower insulating layer 172 may cover the lower surface of the base insulating layer 171. The lower insulating layer 172 may include first lower openings LO1 exposing the first lower pads 175 and second lower openings LO2 exposing the second lower pads 176. The upper insulating layer 173 and/or and the lower insulating layer 172 may include, for example, solder resist.

According to some example embodiments, the first lower openings LO1 may have the same size as that of the first upper openings U01, but are not limited thereto. According to some example embodiments, the second lower openings LO2 may have the same size as that of the third upper openings UO3, but are not limited thereto.

The conductive connectors 160 may be between the interposer 170 and the package substrate 100. The conductive connectors 160 may have a pillar shape extending in the Z direction between the first and second lower pads 175 and 176 of the interposer 170 and the first upper pads 126 of the package substrate 100. Lower portions of the conductive connectors 160 may contact the first upper pads 126 of the package substrate 100. Upper portions of the conductive connectors 160 may contact the first lower pads 175 (and/or the second lower pads 176) of the interposer 170. The conductive connectors 160 may include, for example, a conductive material such as solder and/or copper (Cu).

Each of the capacitor stack structures 150 may include a first capacitor 151 configured to be electrically connected to the package substrate 100 and a second capacitor 155 configured to be electrically connected to the interposer 170. Each of the capacitor stack structures 150 may further include an adhesive film 153 between the first and second capacitors 151 and 155 and bonding the first capacitor 151 to the second capacitor 155.

According to some example embodiments, a Z-directional length Zs of each of the capacitor stack structures 150 may be greater than a Z-directional length of the semiconductor chip 140. According to some example embodiments, the Z-directional length Zs of each of the capacitor stack structures 150 may be approximately equal to a Z-directional length of each of the conductive connectors 160. According to some example embodiments, the Z-directional length Zs of each of the capacitor stack structures 150 may range from about 100 μm to about 250 μm. According to some example embodiments, a Z-directional length Zc of each of the first and second capacitors 151 and 155 may range from about 50 μm to about 100 μm. According to example embodiments, a Z-directional thickness Zd of the adhesive film 153 may be about 10 μm.

The first and second capacitors 151 and 155 may include, for example, at least one of a silicon capacitor, metal-insulator-metal capacitor (MIM), a low inductance ceramic capacitor (LICC), and/or a multilayer ceramic capacitor (MLCC). The first and second capacitors 151 and 155 may be insulated from each other. For example, the first and second capacitors 151 and 155 may be spaced apart from each other with the adhesive film 153 interposed therebetween. The adhesive film 153 may include an insulating material. Active surfaces of the first capacitors 151 may face the package substrate 100, and active surfaces of the second capacitors 155 may face the interposer 170. The inactive surfaces of the first capacitors 151 may face the inactive surfaces of the second capacitors 155. The inactive surfaces of the first capacitors 151 and the inactive surfaces of the second capacitors 155 may be in contact with the adhesive film 153.

A plurality of pads 157 may be disposed on an active surface of each of the first capacitors 151. The pads 157 may contact the capacitor connection bumps 156. The plurality of pads 157 may be configured to be electrically connected to the third upper pads 128 through the capacitor connection bumps 156.

A plurality of pads 159 may be disposed on an active surface of each of the second capacitors 155. The plurality of pads 159 may contact the capacitor connection bumps 158. The plurality of pads 159 may be configured to be electrically connected to the second lower pads 176 through the capacitor connection bumps 158.

According to some example embodiments, the first and second capacitors 151 and 155 included in the package substrate 100 may all be between the package substrate 100 and the interposer 170. In some example embodiments, the semiconductor package 10 may not include a capacitor mounted in the form of a surface-mount device (SMD) on the lower surface of the package substrate 100 and/or an embedded capacitor built in the package substrate 100.

According to some example embodiments, because the semiconductor package 10 does not include an embedded capacitor (e.g., a capacitors which is embedded in a cavity of a package substrate 100), manufacturing cost of the semiconductor package 10 may be reduced. According to some example embodiments, because the semiconductor package 10 does not include a capacitor mounted (e.g., in the form of an SMD) on the lower surface of the package substrate 100, damage to the capacitor in a connection process of the external connection terminals 190 may be prevented and/or mitigated.

According to some example embodiments, due to the capacitor stack structures 150, the semiconductor package 10 may secure a sufficient space for flux cleaning between the semiconductor chip 140 and the interposer 170. Accordingly, a peeling off of the lower insulating layer 172 from the base insulating layer 171, e.g., due to insufficient flux cleaning, may be prevented and/or mitigated.

In addition, the capacitor stack structures 150 may prevent deformation of the conductive connectors 160 including low-hardness solder (and/or the like) even when heat and pressure are applied to the semiconductor package 10. Accordingly, uniformity of a height of the semiconductor package 10 in the Z direction may be improved, and warpage of the semiconductor package 10 may be prevented and/or mitigated.

The semiconductor chip 140 may be disposed in a central portion of the package substrate 100. The conductive connectors 160 may be arranged in rows and columns in an edge region surrounding the semiconductor chip 140. The capacitor stack structures 150 may be between the conductive connectors 160. For example, the capacitor stack structures 150 may be included in the rows and columns of conductive connectors 160.

The insulating filler 180 may be provided on the package substrate 100. The insulating filler 180 may protect the package substrate 100, the semiconductor chip 140, the conductive connectors 160, and the interposer 170 from external environments. The insulating filler 180 may cover at least a portion of each of the package substrate 100, the semiconductor chip 140, the capacitor stack structures 150, the conductive connectors 160, and the interposer 170. For example, the insulating filler 180 may cover an upper surface of the package substrate 100, side and upper surfaces of the semiconductor chip 140, side surfaces of the capacitor stack structures 150, side surfaces of the conductive connectors 160, and a lower surface of the interposer 170.

In some example embodiments, the insulating filler 180 may include an epoxy-group molding resin or a polyimide-group molding resin. For example, the insulating filler 180 may include an epoxy molding compound (EMC).

Figure 3:
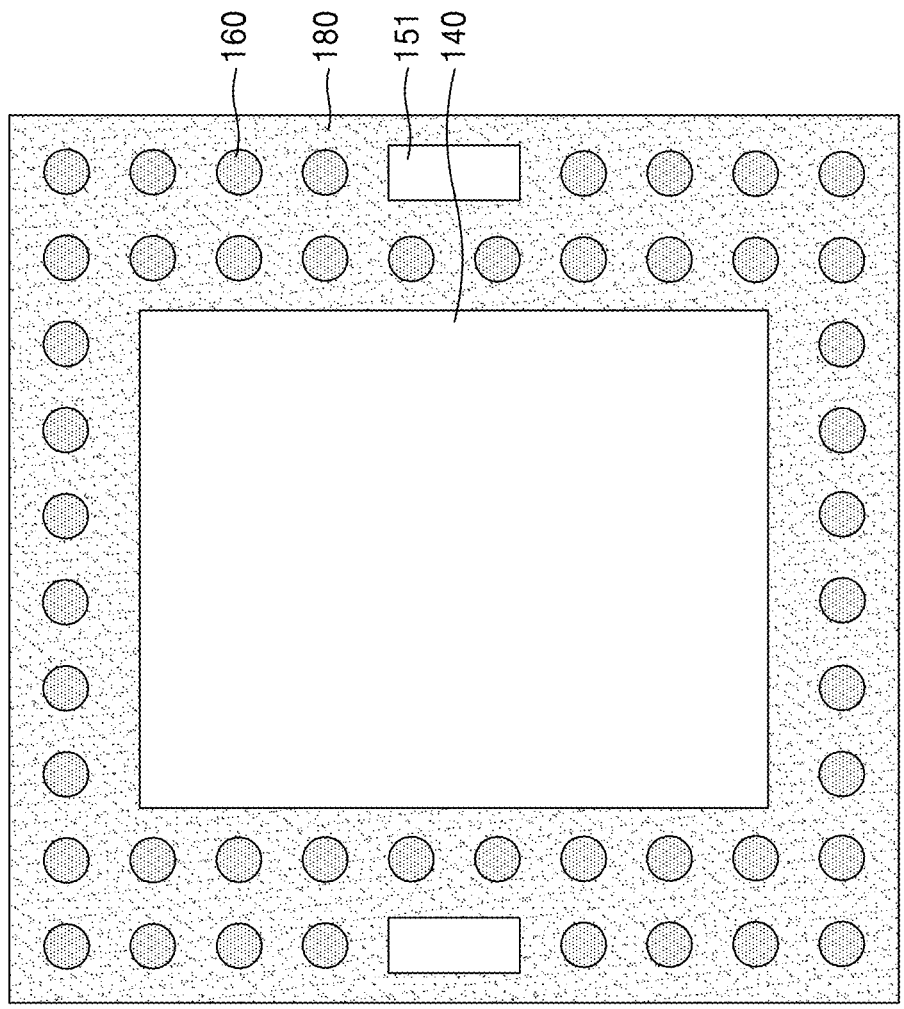
FIGS. 3 and 4 are cross-sectional views illustrating semiconductor packages according to some other example embodiments, each showing a cross-sectional view taken along line I-I' of FIG. 1.
Figure 3:
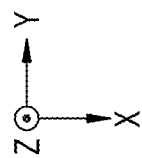
Figure 4:
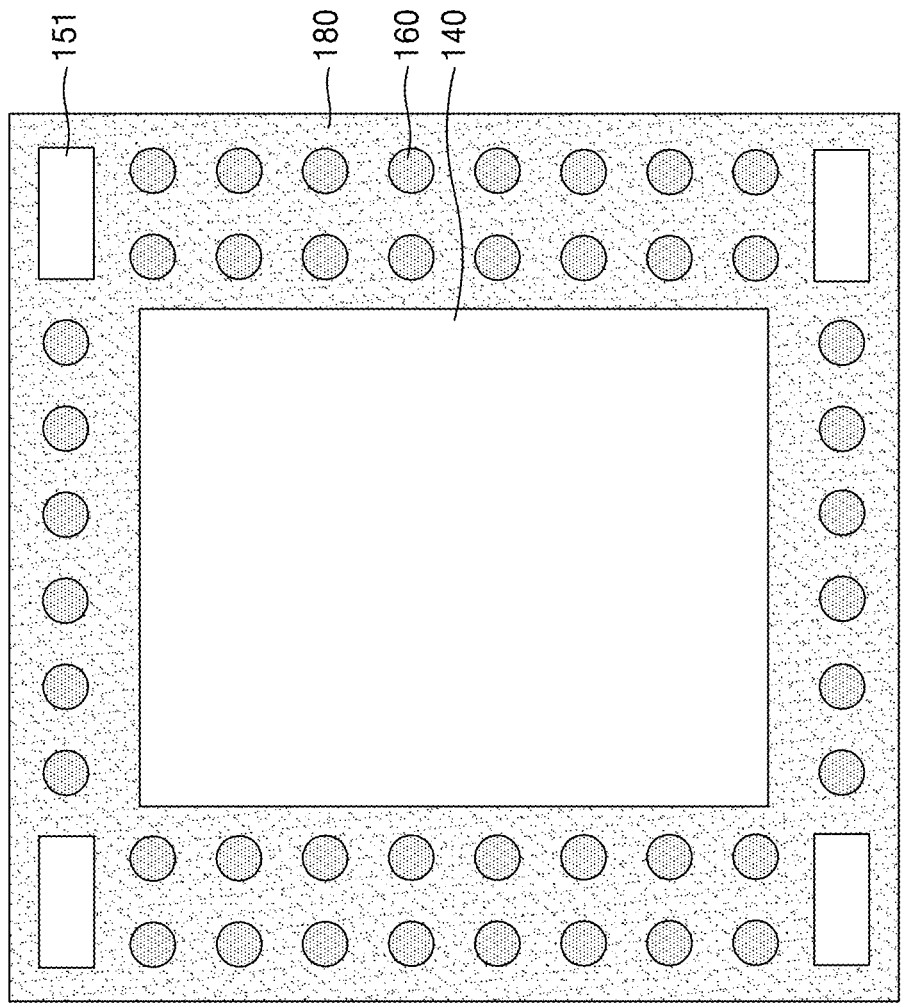

FIGS. 3 and 4 are cross-sectional views illustrating semiconductor packages according to some example embodiments, respectively showing the cross-sectional view taken along line I-I' of FIG. 1.

For convenience of explanation, a description of the same parts as those described above with reference to FIGS. 1 to 2B is omitted and the differences are mainly described.

Referring to FIGS. 1 and 3, two or more capacitor stack structures 150 may be provided to prevent deformation of the conductive connectors 160. The capacitor stack structures 150 may be disposed adjacent to (at least) longer sides (e.g., the X-directional sides) of the semiconductor chip 140. The capacitor stack structures 150 are disposed in an edge region of package substrate 100 in which the conductive connectors 160 are disposed in. Accordingly, if the number of capacitor stack structures 150 increases, the number of conductive connectors 160 may decrease. In the arrangement of FIG. 3, the number of capacitor stack structures 150 may be decreased (or increased), and thus, the number of conductive connectors 160 may be increased (or decreased). Accordingly, the degree of freedom in signal design of the semiconductor package 10 may be enhanced.

Referring to FIGS. 1 and 4, the capacitor stack structures 150 may be disposed adjacent to each of four corners. According to some example embodiments, warpage of the semiconductor package 10 may be prevented by positioning the capacitor stack structures 150 adjacent to each of the four corners.

Figure 5:
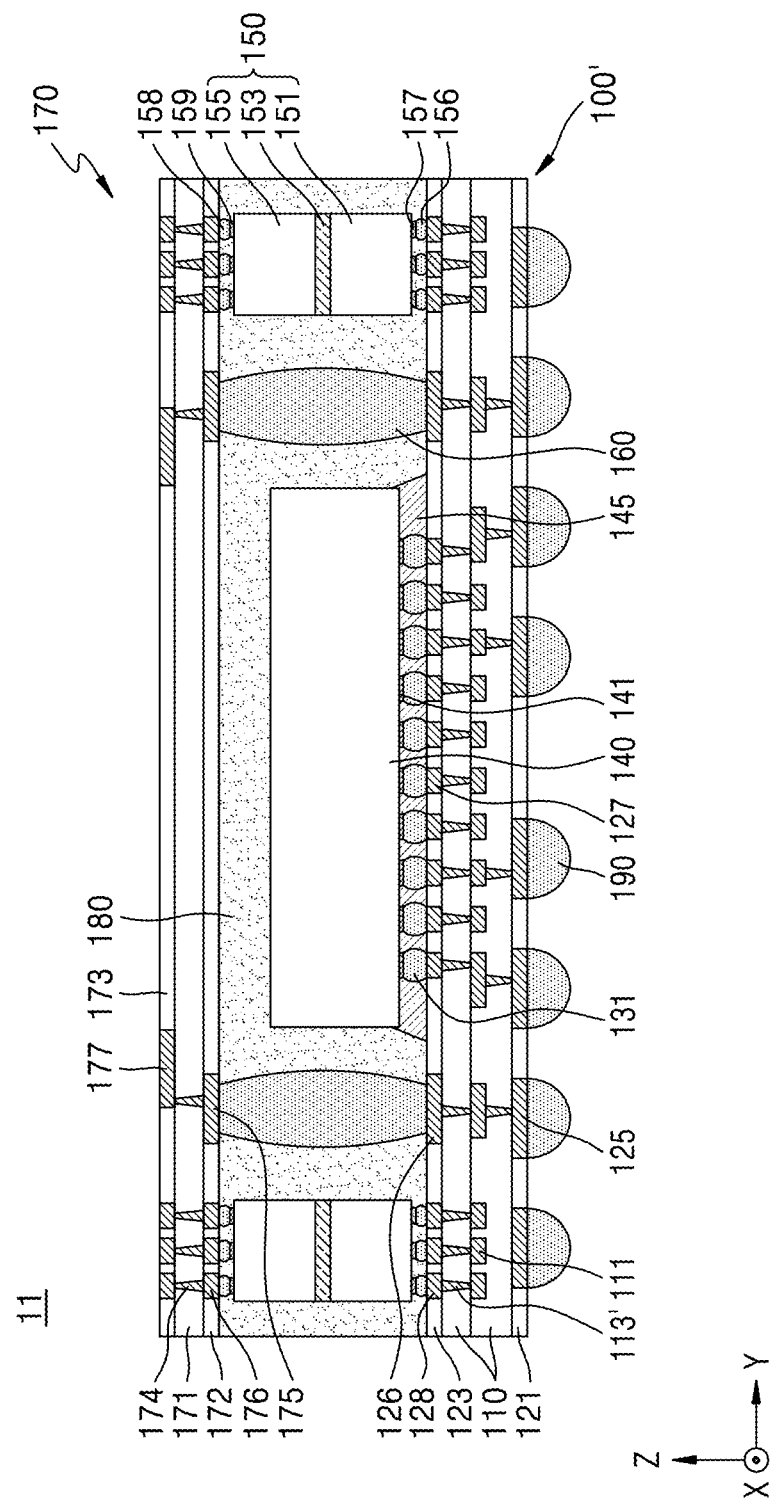
FIG. 5 is a cross-sectional view illustrating a semiconductor package according to some example embodiments.

FIG. 5 is a cross-sectional view illustrating a semiconductor package 11 according to some example embodiments.

For convenience of explanation, a description of the same parts as those described above with reference to FIGS. 1 to 2B is omitted and differences are mainly described.

Referring to FIG. 5, the semiconductor package 11 may include a package substrate 100', a first semiconductor chip 140, capacitor stack structures 150, conductive connectors 160, an interposer 170, and an insulating filler 180.

The package substrate 100' may include a substrate base 110, conductive patterns 111, lower pads 125, and a plurality of upper pads (e.g. first to third upper pads 126, 127, and 128), similar to the package substrate 100 of FIG. 1. The package substrate 100' may further include conductive vias 113' extending in the Z direction. Unlike the conductive vias 113 of FIG. 1, the conductive vias 113' included in the package substrate 100' may be tapered from the upper protective layer 123 toward the lower protective layer 121. The package substrate 100' and the semiconductor chip 140 may be provided, e.g., by a chip last process in which the semiconductor chip 140 is mounted after the package substrate 100' is formed.

Figure 6:
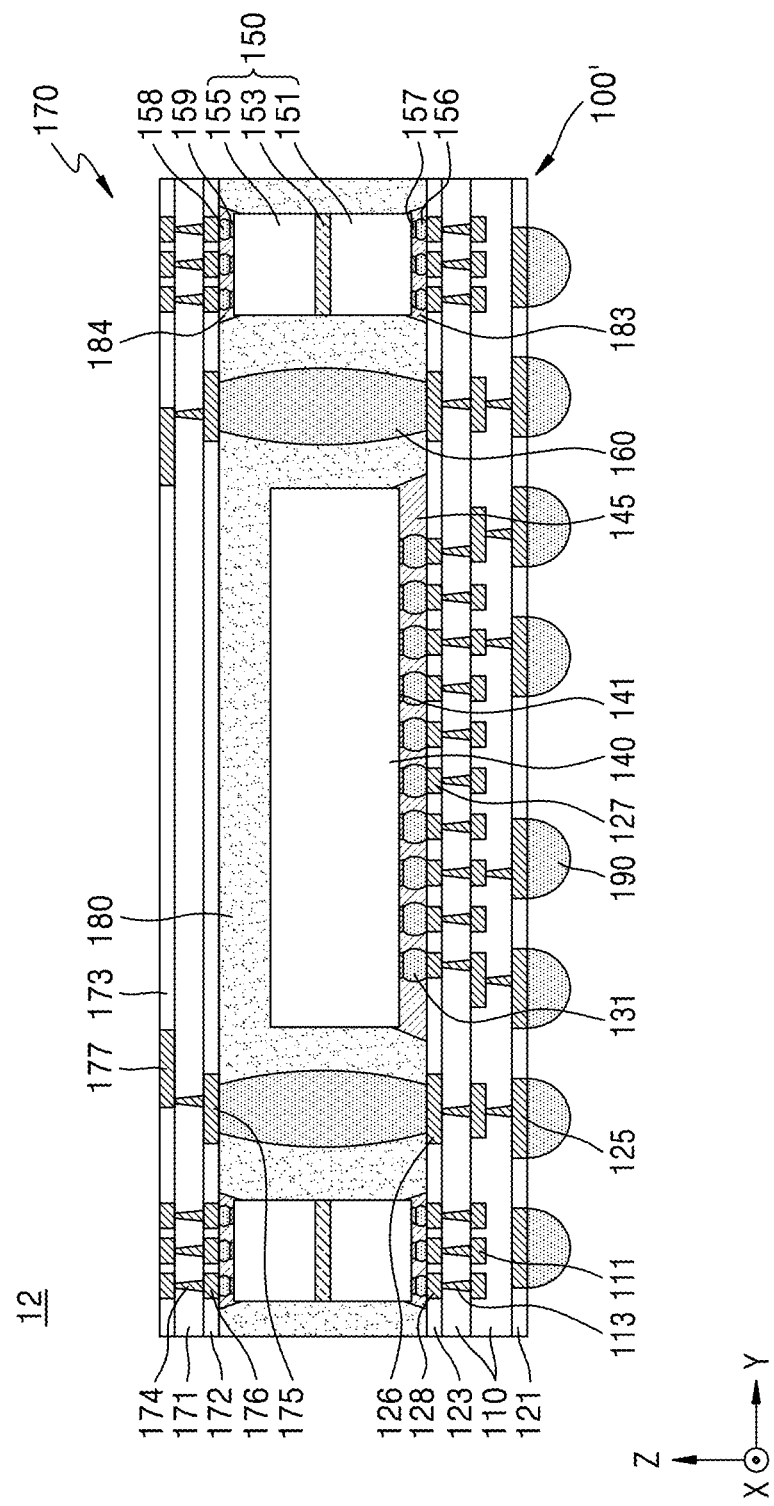
FIG. 6 is a cross-sectional view illustrating a semiconductor package according to some example embodiments.

FIG. 6 is a cross-sectional view illustrating a semiconductor package 12 according to some example embodiments.

For convenience of explanation, a description of the same parts as those described above with reference to FIGS. 1 to 2B is omitted and differences are mainly described.

The semiconductor package 12 is similar to the semiconductor package 10 of FIG. 1, but may further include first and second underfill material layers 183 and 184. In some example embodiments, the first and second underfill material layers 183 and 184 may include an epoxy resin formed by a capillary under-fill process. According to some example embodiments, the first and second underfill material layers 183 and 184 may be non-conductive films.

The first underfill material layers 183 may be between the first capacitor 151 and the package substrate 100. The first underfill material layers 183 may cover the capacitor connection bumps 156. The second underfill material layers 184 may be between the second capacitor 155 and the interposer 170. The second underfill material layers 184 may cover the capacitor connection bumps 158. According to some example embodiments, the first underfill material layers 183 may be omitted and only the second underfill material layers 184 may be provided, and/or the second underfill material layers 184 may be omitted and only the first underfill material layers 183 may be provided.

According to some example embodiments, because the first and second underfill material layers 183 and 184 cover and protect the capacitor connection bumps 156 and 158 and the pads 157 and 159 of the first and second capacitors 151 and 155, the electrical reliability and mechanical robustness of the semiconductor package 12 may be improved.

Figure 7:
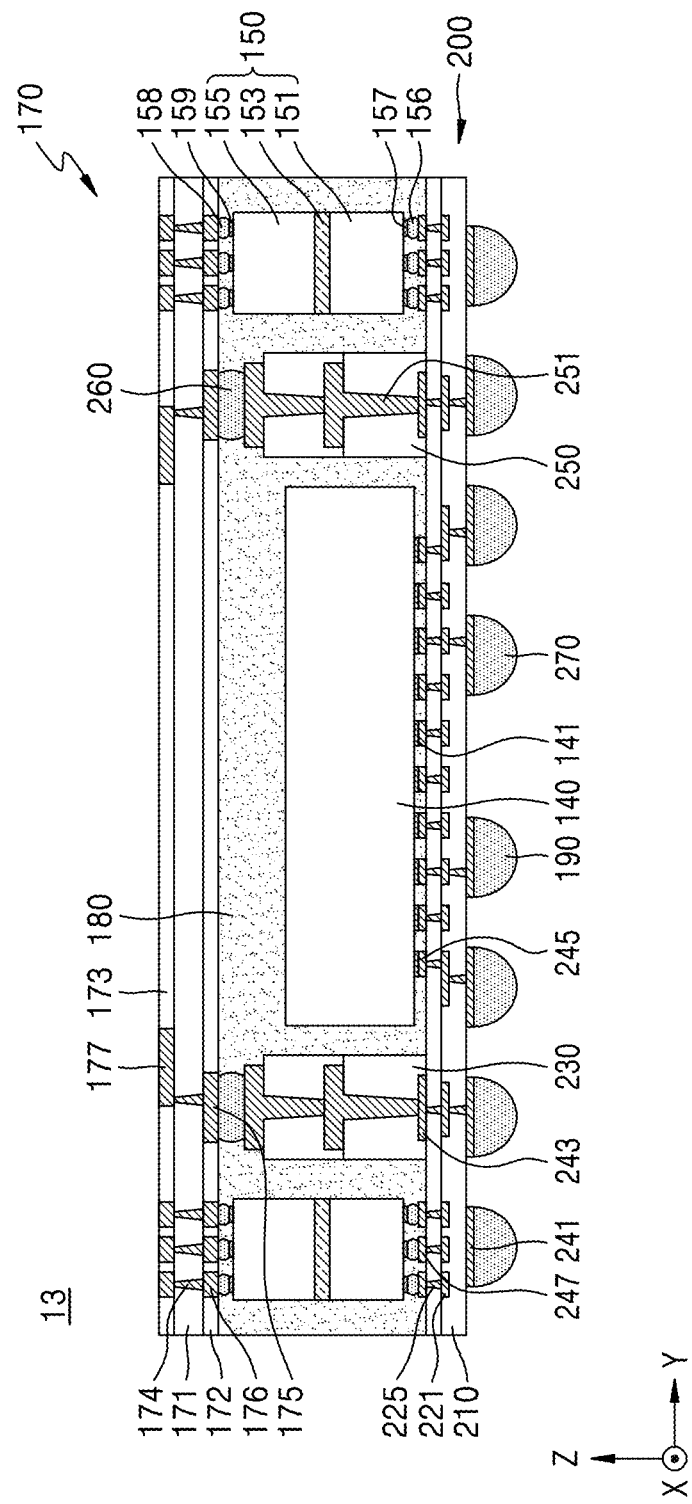
FIG. 7 is a cross-sectional view illustrating a semiconductor package according to some example embodiments.

FIG. 7 is a cross-sectional view illustrating a semiconductor package 13 according to some example embodiments.

For convenience of explanation, a description of the same parts as those described above with reference to FIGS. 1 to 2B is omitted and differences are mainly described.

Referring to FIG. 7, the semiconductor package 13 may include a semiconductor chip 140, capacitor stack structures 150, and an interposer. The semiconductor package 13 may include a redistribution layer 200 formed under the semiconductor chip 140 and a capacitor stack structure 150 between the redistribution layer 200 and the interposer 170.

The redistribution layer 200 may include redistribution patterns 221 and redistribution vias 225 formed in the insulating layers 210. The redistribution patterns 221 may extend in a horizontal direction (e.g., the X-direction and/or the Y-direction), and the redistribution vias 225 may extend in a vertical direction (e.g., the Z-direction). In some example embodiments, the redistribution patterns 221 may have a thickness less than that of the conductive patterns 111 of FIG. 1, and the redistribution vias 225 may have a horizontal thickness and a vertical length less than those of the conductive vias 113.

Lower redistribution pads 241 for connection to the connection terminals 190 may be formed under the insulating layers 210. On the insulating layers 210, first upper redistribution pads 243 connected to through vias (e.g., silicon vias (TSVs)) 251, second upper redistribution pads 245 connected to the chip pads 141 of the semiconductor chip 140, and third upper redistribution pads 247 for connection to the first capacitor 151 may be disposed.

According to some example embodiments, horizontal widths (e.g., the X-directional and/or Y-directional widths) of the first upper redistribution pads 243 may be greater than horizontal widths (e.g., the X-directional and/or Y-directional widths) of the third upper redistribution pads 247. According to some example embodiments, the horizontal widths (e.g., the X-directional and/or Y-directional widths) of the second upper redistribution pads 245 may be greater than horizontal widths (e.g., the X-directional and/or Y-directional widths) of the third upper redistribution pads 247.

Insulating layers 250 may horizontally surround the semiconductor chip 140. The insulating layers 250 and the vias 251 may comprise a connection structure. A connection terminal 260 may be provided between the vias 251 and the first lower pads 175. The connection terminal 260 may provide an electrical connection between the vias 251 and the first lower pads 175. Although two insulating layers 250 and two vias 251 are illustrated in FIG. 7, the number of insulating layers 250 and vias 251 in each connection structure are not so limited. For example, the redistribution layer 200 and the interposer 170 may also be connected by a single insulating layer and/or a single via. The insulating layer may comprise an insulating material, such as a plastic and/or resin.

The insulating filler 180 may fill a space between the semiconductor chip 140 and the insulating layers 250 and between the insulating layers 250 and the capacitor stack structure 150.

According to some example embodiments, the semiconductor package 13 may be a fan out panel level package. Accordingly, a packaging process may be simultaneously performed on a large number of semiconductor chips 140, and the productivity of the semiconductor package 13 may be improved.

Figure 8:
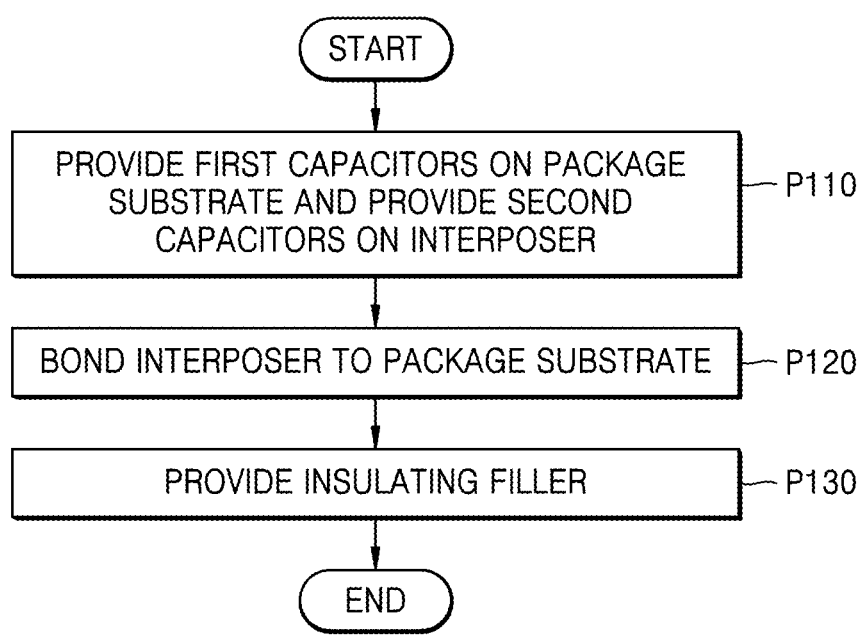
FIG. 8 is a flowchart illustrating a method of manufacturing a semiconductor package, according to some example embodiments.
Figure 9A:
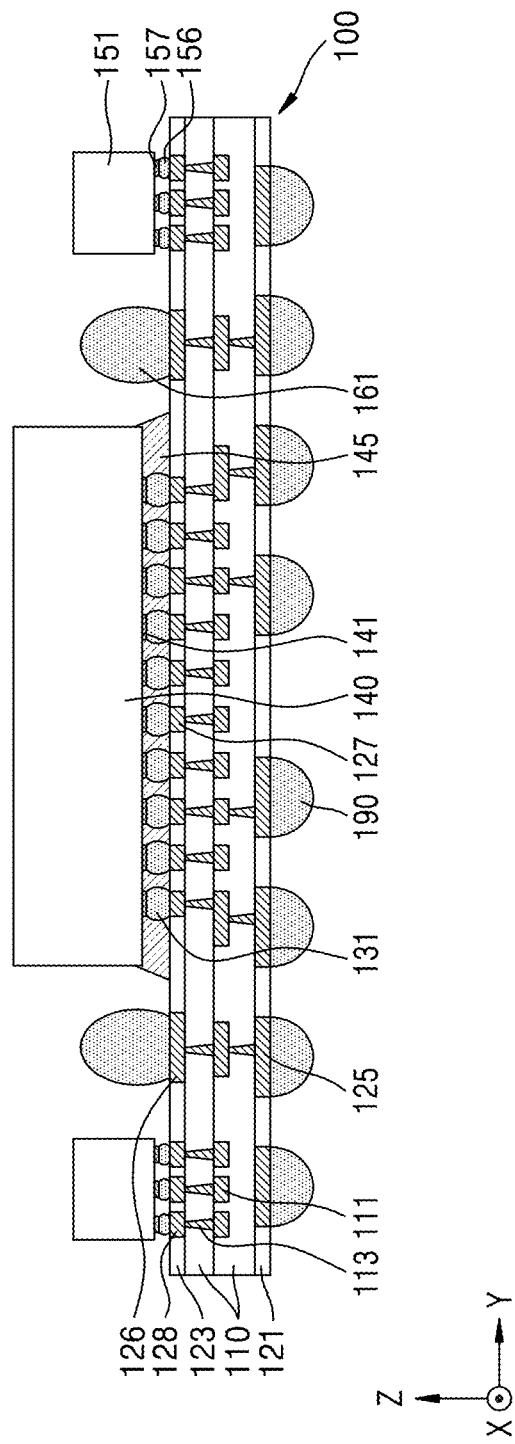
FIGS. 9A to 10 are cross-sectional views illustrating a method of manufacturing a semiconductor package, according to some example embodiments.
Figure 9B:
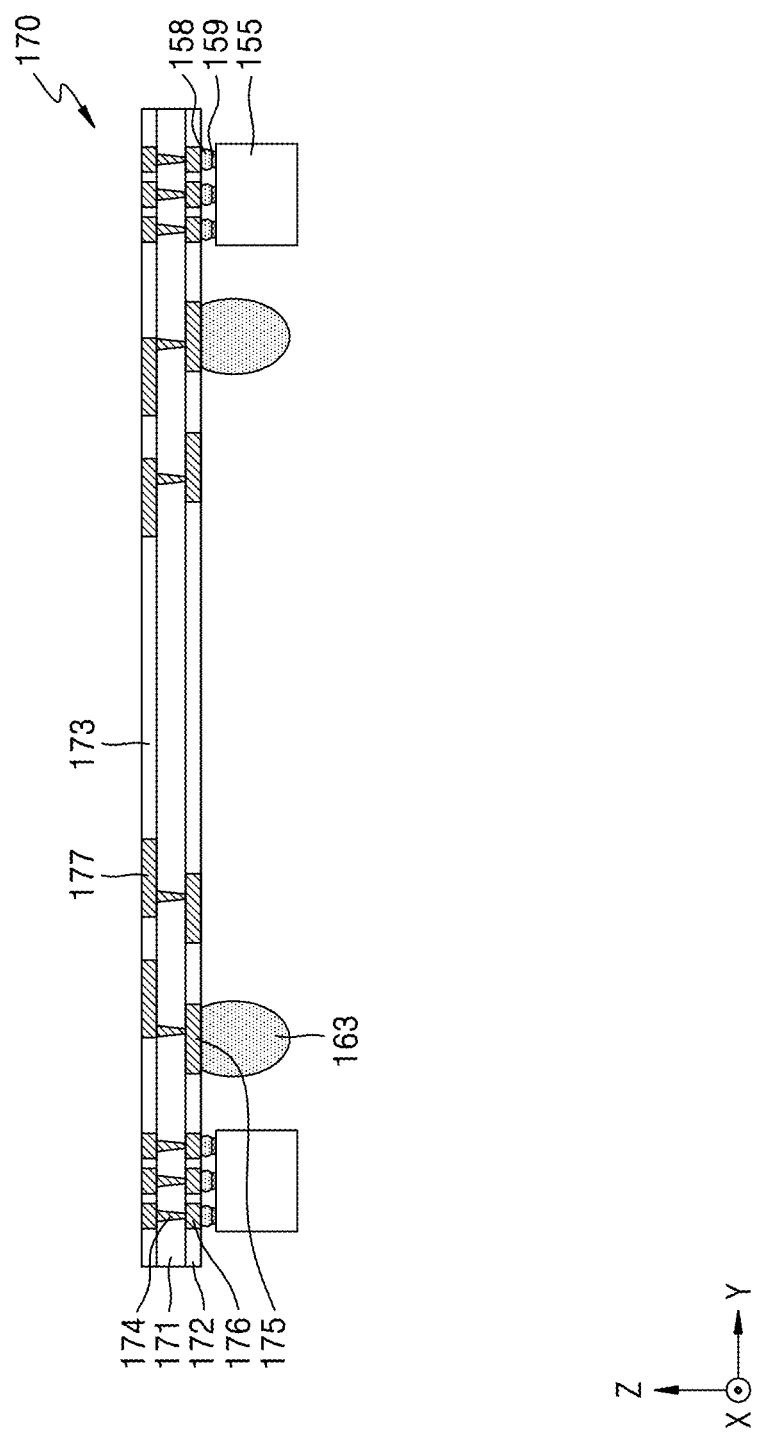
Figure 10:
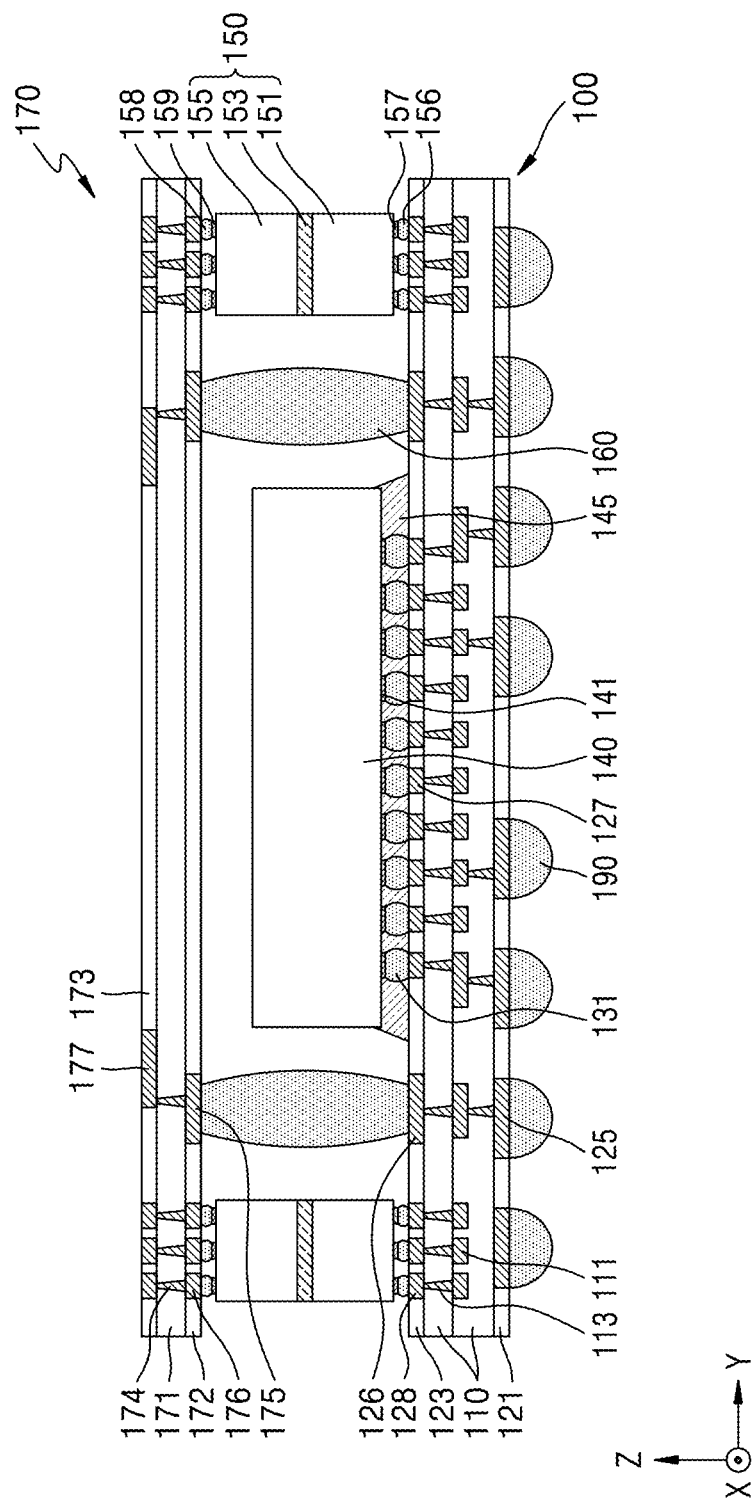

FIG. 8 is a flowchart illustrating a method of manufacturing a semiconductor package, according to some example embodiments; and FIGS. 9A to 10 are cross-sectional views illustrating a method of manufacturing a semiconductor package, according to some example embodiments.

Referring to FIGS. 8 to 9B, in operation P110, the first capacitor 151 may be provided to the package substrate 100 (e.g., in FIG. 9A) and the second capacitor 155 may be provided to the interposer 170 (e.g., in FIG. 9B). According to some example embodiments, after the first and second capacitors 151 and 155 are provided, the first and/or second underfill material layers 183 and/or 184 of FIG. 6 may be further provided.

According to some example embodiments, the package substrate 100 may be provided, e.g., by a wafer-level fan out packaging process. The package substrate 100 may be provided, e.g., by a chip first process in which the semiconductor chip 140 is first provided and then the package substrate 100 is formed.

First conductive connectors 161 may be provided on the package substrate 100, and second conductive connectors 163 may be further provided on the interposer 170. The first and second conductive connectors 161 and 163 may include the same material as that of the conductive connectors 160 of FIG. 1.

Subsequently, referring to FIGS. 8 and 10, the interposer 170 may be bonded to the package substrate 100 in operation P120.

Bonding the interposer 170 to the package substrate 100 may include forming the conductive connectors 160 by reflowing or thermocompressing the first and second conductive connectors 161 and 163. Bonding the interposer 170 to the package substrate 100 may further include providing an adhesive film 153 to (at least) one of the first and second capacitors 151 and 155 to combine the first and second capacitors 151 and 155 with each other to provide the capacitor stack structure 150.

According to some example embodiments, a sufficient space for flux cleaning may be provided between the semiconductor chip 140 and the interposer 170 due to the capacitor stack structure 150, thereby preventing damage to the lower protective layer 172. Also, due to the capacitor stack structure 150, deformation of the first and second conductive connectors 161 and 162 during a reflow or thermocompression process may be prevented and/or mitigated.

Subsequently, referring to FIGS. 8, 10, and 1, the insulating filler 180 may be provided in operation P130. So far, the method of manufacturing the semiconductor package 10 of FIG. 1 has been described. A person skilled in the art may be able to reach the method of manufacturing the semiconductor packages 11, 12, and 13 shown in FIGS. 5 to 7 based on the description herein.

Figure 11:
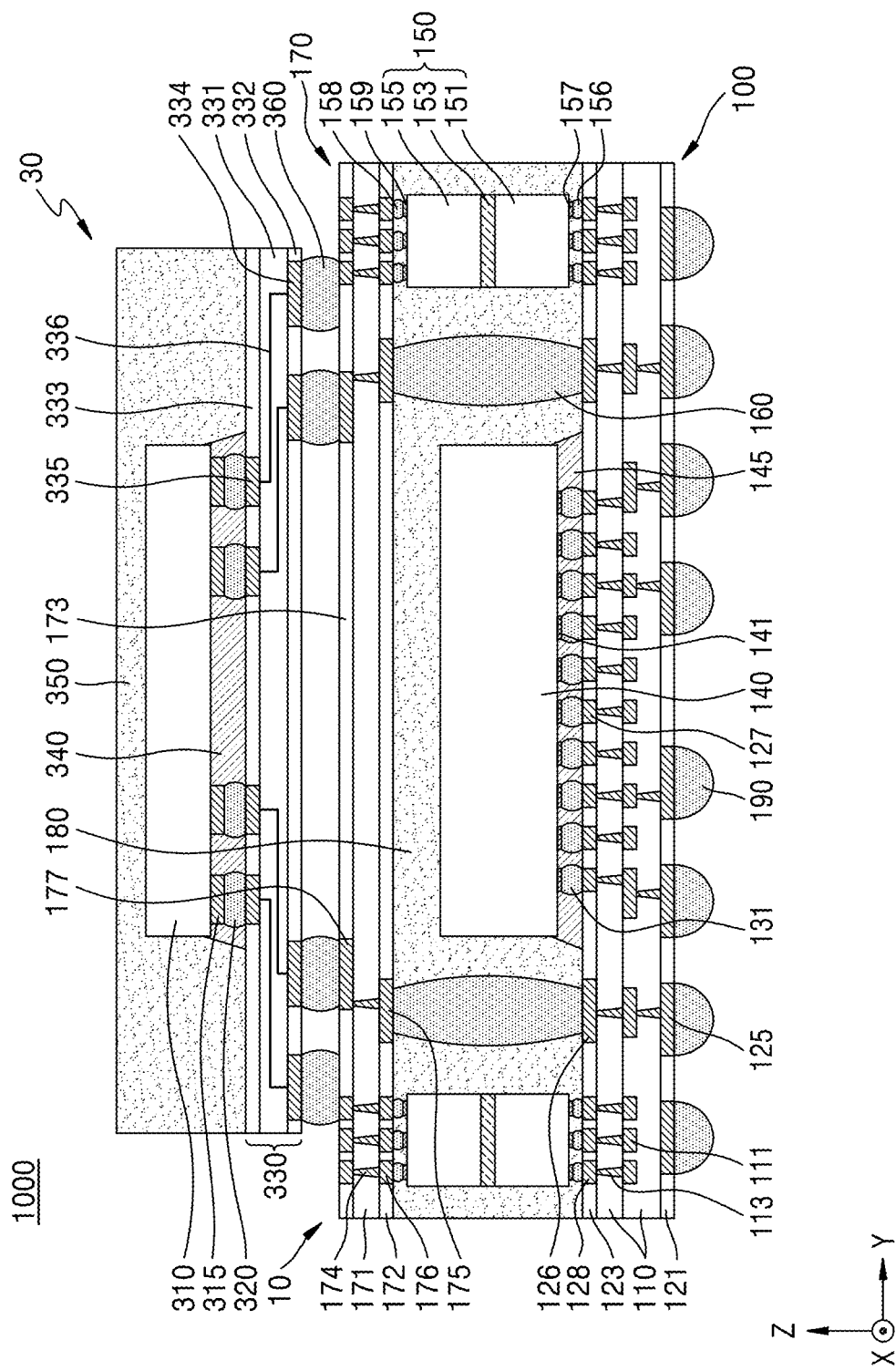
FIG. 11 is a cross-sectional view illustrating a semiconductor package according to some example embodiments.

FIG. 11 is a cross-sectional view illustrating a semiconductor package 1000 according to some example embodiments.

Referring to FIG. 11, the semiconductor package 1000 may include a semiconductor package 10 and a semiconductor package 30. The semiconductor package 1000 may be a package-on-package type semiconductor package in which the semiconductor package 30 is stacked on the semiconductor package 10. Hereinafter, the semiconductor package 10 may be referred to as a lower semiconductor package, and the semiconductor package 30 may be referred to as an upper semiconductor package.

The semiconductor package 30 may include a semiconductor chip 310, a package substrate 330, and a molding layer 350.

The package substrate 330 may be, for example, a circuit board (e.g., PCB). The package substrate 330 may include a substrate base 331 including a plastic and/or resin such as at least of a phenol resin, an epoxy resin, and/or polyimide. Also, the package substrate 330 may include upper pads 335 disposed on an upper surface of the substrate base 331 and lower pads 334 disposed on a lower surface of the substrate base 331. Wires 336 and/or a redistribution pattern (not shown) configured to be electrically connected to the upper pads 335 and the lower pads 334 may be formed in the substrate base 331. An upper protective layer 333 covering the upper surface of the substrate base 331 and exposing the upper pads 335 may be disposed on the upper surface of the substrate base 331. A lower protective layer 332 covering the lower surface of the substrate base 331 and exposing the lower pads 334 may be disposed on the lower surface of the substrate base 331.

The package substrate 330 may be mounted on the interposer 170. The package substrate 330 may be connected to the interposer 170 through connection terminals 360 disposed on the interposer 170. The connection terminals 360 may be respectively connected to the upper pads 177 of the interposer 170 and the lower pads 334 of the second package substrate 330 to electrically connect the upper pads 177 of the interposer 170 to the lower pads 334 of the second package substrate 330.

The semiconductor chip 310 may be disposed on the package substrate 330. For example, chip pads 315 of the semiconductor chip 310 may be electrically connected to the upper pads 334 of the package substrate 330 through chip connection bumps 320. An underfill material layer 340 surrounding the chip connection bumps 320 may be between the semiconductor chip 310 and the package substrate 330.

In some example embodiments, the semiconductor chip 140 and the semiconductor chip 310 may be the same type of semiconductor chips. In some example embodiments, the semiconductor chip 140 and the semiconductor chip 310 may be different types of semiconductor chips. For example, when the semiconductor chip 140 is a logic chip, the semiconductor chip 310 may be a memory chip. In some example embodiments, the semiconductor chip 310 may be implemented as a high bandwidth memory (HBM) chip. In some example embodiments, the semiconductor package 1000 may be configured to operate as a single system in which different types of semiconductor chips and components (such as passive devices) are electrically connected to each other.

The molding layer 350 may be disposed on the second package substrate 330 to cover at least a portion of the semiconductor chip 310. The molding layer 350 may include, for example, an epoxy-group molding resin or a polyimide-group molding resin. For example, the molding layer 350 may include an epoxy molding compound.

So far, the semiconductor package 1000 including the semiconductor package 10 of FIG. 1 has been described, but those skilled in the art may easily reach the example including the semiconductor packages 11, 12, and 13 described above with reference to FIGS. 5 to 7 based on the description herein.

While the inventive concepts have been particularly shown and described with reference to some example embodiments thereof, it will be understood that various changes in form and details may be made therein without departing from the spirit and scope of the following claims.

What is claimed is:

1. A semiconductor package comprising:
a package substrate;
an interposer;
a semiconductor chip between the package substrate and the interposer;
a plurality of conductive connectors between the package substrate and the interposer; and
a capacitor stack structure between the package substrate and the interposer, the capacitor stack structure including a first capacitor and a second capacitor stacked on the first capacitor,
wherein an upper surface of the first capacitor includes contact pads bonded to the package substrate and a lower surface of the first capacitor faces an upper surface of the second capacitor and a lower surface of the second capacitor includes contact pads bonded to the interposer, and
wherein the lower surface of the first capacitor and the upper surface of the second capacitor are insulated from each other.

2. The semiconductor package of claim 1, wherein the first and second capacitors are insulated from each other.

3. The semiconductor package of claim 1, further comprising:
an adhesive film adhering the first capacitor to the second capacitor.

4. The semiconductor package of claim 3, wherein the adhesive film includes a non-conductive adhesive film.

5. The semiconductor package of claim 1, wherein the package substrate does not include a capacitor on a lower surface of the package substrate.

6. The semiconductor package of claim 1, wherein at least one of the first capacitor or the second capacitor includes at least one of a silicon capacitor, a low inductance ceramic capacitor (LICC), or a multilayer ceramic capacitor (MLCC).

7. The semiconductor package of claim 1, further comprising:
an upper semiconductor package on the interposer,
wherein the semiconductor chip includes a logic chip and the upper semiconductor package includes a memory chip.

8. The semiconductor package of claim 1, wherein the package substrate includes:
a substrate base;
first upper pads on an upper surface of the substrate base and connected to the plurality of conductive connectors;
second upper pads on the upper surface of the substrate base and connected to the first capacitor; and
an upper protective layer covering the upper surface of the substrate base, the upper protective layer including first openings exposing the first upper pads and second openings exposing the second upper pads, and
wherein a horizontal width of each of the first openings is greater than a horizontal width of each of the second openings.

9. The semiconductor package of claim 8, wherein
the package substrate further includes third upper pads on the upper surface of the substrate base and connected to the semiconductor chip,
the upper protective layer further includes third openings exposing the third upper pads, and
a horizontal width of each of the third openings is greater than the horizontal width each of the second openings.

10. The semiconductor package of claim 8, wherein
the horizontal width of the first openings ranges from 100 μm to 200 μm, and
the horizontal width of the second openings ranges from 10 μm to 100 μm.

11. The semiconductor package of claim 1, wherein a length of the capacitor stack structure in a first direction perpendicular to the package substrate is greater than a length of the semiconductor chip in the first direction.

12. The semiconductor package of claim 1, wherein a length of the capacitor stack structure in a first direction perpendicular to the package substrate ranges from 100 μm to 250 μm.

13. The semiconductor package of claim 1, wherein a length of at least one of the first capacitor or the second capacitor in a first direction perpendicular to the package substrate ranges from 50 μm to 100 μm.

14. A semiconductor package comprising:
a package substrate;
an interposer;
a logic chip between the package substrate and the interposer;
conductive connectors configured to be electrically connected to each of the interposer and the package substrate;
a capacitor stack structure between the interposer and the package substrate, the capacitor stack structure including a first capacitor configured to be electrically connected to the package substrate, a second capacitor to configured to be electrically connected to the interposer, and an adhesive film adhering the first and second capacitors to each other;
a filler between the package substrate and the interposer and contacting the logic chip and the conductive connectors; and
an upper semiconductor package on the interposer and including one or more memory chips,
wherein an upper surface of the first capacitor includes contact pads bonded to the package substrate and a lower surface of the first capacitor faces an upper surface of the second capacitor and a lower surface of the second capacitor includes contact pads bonded to the interposer.

15. The semiconductor package of claim 14, further comprising:
chip connection bumps configured to provide an electrical path between the logic chip and the package substrate; and
capacitor connection bumps configured to provide an electrical path between the first capacitor and the package substrate,
wherein each of the capacitor connection bumps is smaller than each of the chip connection bumps.

16. The semiconductor package of claim 15, further comprising:

an underfill material layer between the first capacitor and the package substrate and covering the capacitor connection bumps.

17. The semiconductor package of claim 14, wherein a length of the capacitor stack structure in a vertical direction perpendicular to the package substrate is greater than a length of the logic chip in the vertical direction.

18. The semiconductor package of claim 14, wherein the first capacitor and the second capacitor are insulated from each other.

19. A semiconductor package comprising:
 a redistribution layer including
  insulating layers,
  redistribution patterns extending in a horizontal direction within the insulating layers;
  redistribution vias connected to at least one of the redistribution patterns and extending in a vertical direction within the insulating layers; and
  first and second redistribution pads on the insulating layers and connected to at least one of the redistribution vias;
 an interposer;
 a logic chip between the redistribution layer and the interposer;
 an insulating layer between the redistribution layer and the interposer and surrounding the logic chip;
 a plurality of vias penetrating through the insulating layers in the vertical direction and connected to the first redistribution pads; and
 a capacitor stack structure between the redistribution layer and the interposer, the capacitor stack structure having a length in the vertical direction greater than a length of the logic chip in the vertical direction,
 wherein the capacitor stack structure does not include an electrical path between the redistribution layer and the interposer.

20. The semiconductor package of claim 19, wherein the capacitor stack structure includes:
 a first capacitor configured to be electrically connected to the second redistribution pads;
 a second capacitor configured to be electrically connected to the interposer; and
 an adhesive film between the first and second capacitors.

* * * * *